US011584641B2

(12) United States Patent
Tani et al.

(10) Patent No.: US 11,584,641 B2
(45) Date of Patent: Feb. 21, 2023

(54) METHOD FOR MANUFACTURING THREE-DIMENSIONALLY STRUCTURED MEMBER, METHOD FOR MANUFACTURING ACCELERATION PICKUP, ACCELERATION PICKUP, AND ACCELERATION SENSOR

(71) Applicant: TOKYO KEIKI INC., Tokyo (JP)

(72) Inventors: Kazuaki Tani, Tokyo (JP); Takayoshi Yamaguchi, Tokyo (JP); Takayuki Tamaki, Tokyo (JP)

(73) Assignee: TOKYO KEIKI INC., Tokyo (JP)

( * ) Notice: Subject to any disclaimer, the term of this patent is extended or adjusted under 35 U.S.C. 154(b) by 0 days.

(21) Appl. No.: 17/261,213

(22) PCT Filed: Jul. 16, 2019

(86) PCT No.: PCT/JP2019/027916
§ 371 (c)(1),
(2) Date: Jan. 19, 2021

(87) PCT Pub. No.: WO2020/017498
PCT Pub. Date: Jan. 23, 2020

(65) Prior Publication Data
US 2021/0278433 A1 Sep. 9, 2021

(30) Foreign Application Priority Data

Jul. 17, 2018 (JP) .............................. JP2018-133891

(51) Int. Cl.
*B81C 1/00* (2006.01)
*B81B 3/00* (2006.01)
(Continued)

(52) U.S. Cl.
CPC ........ *B81C 1/00555* (2013.01); *B81B 3/0027* (2013.01); *B81C 1/00547* (2013.01);
(Continued)

(58) Field of Classification Search
CPC ............... G01P 15/0802; G01P 15/125; G01P 2015/0828; G01P 15/131; B81B 3/0027;
(Continued)

(56) References Cited

U.S. PATENT DOCUMENTS 5,738,757 A * 4/1998 Burns ................... H01L 21/308
430/494
6,251,698 B1 * 6/2001 Lefort ................. G01P 15/0802
438/22

(Continued)

FOREIGN PATENT DOCUMENTS

CN 102602879 A 7/2012
EP 0369352 A1 5/1990
(Continued)

OTHER PUBLICATIONS

International Search Report for International Application No. PCT/JP2019/027916; dated Oct. 15, 2019.

*Primary Examiner* — Yasser A Abdelaziez
(74) *Attorney, Agent, or Firm* — Cantor Colburn LLP

(57) ABSTRACT

The purpose of the present invention is to provide a method for manufacturing a three-dimensionally structured member which can be made by a simpler process. The method for manufacturing a three-dimensionally structured member includes shaping a flat plate-shaped base member to produce a three-dimensionally structured member having a plurality of sections that are different from one another in thickness. The manufacturing method comprises: a mask formation step for forming a mask over the whole of at least one main surface of the base member; a mask removal step for removing a part of the mask; and an etching step for etching an exposed part of the base member wherein a combination of the mask removal step and the etching step is performed on the mask and the base member that correspond to each of the plurality of sections of the three-dimensionally struc- (Continued)

tured member, in the order from thinnest to the thickest of thicknesses of the three-dimensionally structured members.

8 Claims, 7 Drawing Sheets

(51) Int. Cl.
*G01P 15/08* (2006.01)
*G01P 15/125* (2006.01)
(52) U.S. Cl.
CPC ........ *G01P 15/0802* (2013.01); *G01P 15/125* (2013.01); *B81B 2201/0235* (2013.01); *B81C 1/00388* (2013.01); *B81C 2201/013* (2013.01)
(58) Field of Classification Search
CPC ...... B81B 2201/0235; B81B 2203/058; B81C 1/00166; B81C 1/00333; B81C 1/00547; B81C 1/00388; B81C 1/00555; B81C 2201/013; B81C 1/0015; B81C 2201/0133
See application file for complete search history.

(56) References Cited

U.S. PATENT DOCUMENTS

| | | |
|---|---|---|
| 2003/0071542 A1 | 4/2003 | Satoh et al. |
| 2003/0113982 A1* | 6/2003 | Yamaguchi ......... G01P 15/0802 438/455 |
| 2006/0037398 A1* | 2/2006 | Rich ..................... G01P 15/123 73/514.25 |
| 2009/0130822 A1* | 5/2009 | Collet .................. F04B 43/046 257/E21.705 |
| 2010/0083760 A1 | 4/2010 | Dwyer |

FOREIGN PATENT DOCUMENTS

| | | |
|---|---|---|
| JP | H05087831 A | 9/1991 |
| JP | H10325762 A | 12/1998 |
| JP | 2008070356 A | 3/2008 |
| JP | 2009222540 A | 10/2009 |
| JP | 2010091564 A | 4/2010 |

* cited by examiner

METHOD FOR MANUFACTURING THREE-DIMENSIONALLY STRUCTURED MEMBER, METHOD FOR MANUFACTURING ACCELERATION PICKUP, ACCELERATION PICKUP, AND ACCELERATION SENSOR

CROSS REFERENCE TO RELATED APPLICATIONS

This application is the U.S. National Stage of PCT/JP2019/027916, filed Jul. 16, 2019, which is incorporated herein reference and which claimed priority to Japanese Application No. 2018-133891, filed Jul. 17, 2018 which is also incorporated herein reference. The present application likewise claims priority under 35 U.S.C. § 119 to Japanese Application No. 2018-133891, filed Jul. 17, 2018, the entire content of which is also incorporated herein by reference.

TECHNICAL FIELD

The present invention relates to a method for manufacturing a three-dimensional structural member having a plurality of portions different in thickness by molding a flat plate-like base. Further, the present invention relates to a method for manufacturing an acceleration pickup member for use in an acceleration sensor, an acceleration pickup member manufactured by the manufacturing method, and an acceleration sensor including the acceleration pickup member.

BACKGROUND ART

For example, there is a capacitance type (MEMS (Micro Electro Mechanical System) type) acceleration sensor including an acceleration pickup member including a pendulum section swinging in accordance with the acceleration (for example, see Patent Document 1). Such an acceleration sensor or an acceleration pickup member can detect tilt, motion, vibration, impact, etc. and is used for various purposes such as measurement of acceleration and shaking of a moving body, analysis of vibration and tilt, and measurement, monitoring, warning, etc. of earthquakes (for example, see Patent Documents 2 and 3).

Such an acceleration pickup member includes a pendulum section swinging in accordance with the acceleration, a hinge section coupled to the pendulum section, a support section supporting the pendulum section through the hinge section, and a through groove section between the pendulum section and the support section.
Patent Document 1: Japanese Unexamined Patent Application, Publication No. 2008-70356
Patent Document 2: Japanese Unexamined Patent Application, Publication No. 2009-222540
Patent Document 3: Japanese Unexamined Patent Application, Publication No. H10-325762

DISCLOSURE OF THE INVENTION

Problems to be Solved by the Invention

The present inventors of this application attempted to obtain such an acceleration pickup member by molding one flat plate-like base. However, the support section, the pendulum section, and the hinge section in the acceleration pickup member are different in thickness and the through groove section is provided between the support section and the pendulum section, and therefore a molding process of each section is complicated.

For example, when a three-dimensional shape having a plurality of stepped portions and a portion partly penetrating a base is molded, it becomes difficult to apply a resist by a spin coating method with an increase in the processing depth. Although only the penetrating portion can be processed by laser processing, it is generally difficult to form stepped portions having an arbitrary depth with the base material limited to quartz or the like.

For example, the resist application to deep stepped portions can be realized by a spray method. However, since conditions vary depending on the difference in shape of unevenness (difference in ease of flow of a spray and the like), the conditions are complicated for a shape in which a deeply etched part forming a penetrating portion and a shallow stepped portion coexist. Further, when a dipping method is used as the resist application to a large step, the resist is likely to stay in a recessed section. Thus, the dipping method is difficult to apply particularly after the formation of the penetrating portion.

It is an object of the present invention to provide a method for manufacturing a three-dimensional structural member and a method for manufacturing an acceleration pickup member enabling the simplification of manufacturing. Further, it is an object of the present invention to provide an acceleration pickup member manufactured by the manufacturing method and an acceleration sensor including the acceleration pickup member.

Means for Solving the Problems (1) A method for manufacturing a three-dimensional structural member according to the present invention is a method for manufacturing a three-dimensional structural member having a plurality of portions different in thickness by molding a flat plate-like base, and the method includes: a mask forming step of forming a mask over at least one principal surface of the base; a mask removing step of removing a part of the mask; and an etching step of etching an exposed portion of the base, in which a combination of the mask removing step and the etching step is performed to the mask and the base corresponding to each of the plurality of portions of the three-dimensional structural member in the order of thinnest to thickest of the three-dimensional structural member.

(2) In the method for manufacturing a three-dimensional structural member described above, the mask in the mask forming step may be a positive resist, and a part of the mask may be exposed to light and thereby removed in the mask removing step.

(3) Another method for manufacturing a three-dimensional structural member according to the present invention is a method for manufacturing a three-dimensional structural member having four portions different in thickness by molding a flat plate-like base, and the method includes: a mask forming step of forming a mask over at least one principal surface of the base; a first mask removing step of removing a part of the mask corresponding to the thinnest portion of the three-dimensional structural member; a first etching step of etching an exposed portion of the base corresponding to the thinnest portion of the three-dimensional structural member; a second mask removing step of removing a part of the mask corresponding to the second thinnest portion of the three-dimensional structural member; a second etching step of etching exposed portions of the base corresponding to the second thinnest portion and the thinnest portion of the three-dimensional structural member; a third mask removing step of removing a part of the mask corresponding to the third thinnest portion of the three-dimensional structural member; and a third etching step of etching exposed portions of the base corresponding to the third thinnest portion, the second thinnest portion, and the thinnest portion of the three-dimensional structural member.

(4) In the method for manufacturing a three-dimensional structural member described above, the mask in the mask forming step may be a positive resist, and a part of the mask may be exposed to light and thereby removed in the first mask removing step, the second mask removing step, and the third mask removing step.

(5) A method for manufacturing an acceleration pickup member according to the present invention is a method for manufacturing an acceleration pickup member for use in an acceleration sensor by molding a flat plate-like base, the acceleration pickup member including a pendulum section, a hinge section coupled to the pendulum section, a support section supporting the pendulum section through the hinge section, and a through groove section between the pendulum section and the support section; and the method includes: a mask forming step of forming a mask over each principal surface of the base; a first mask removing step of removing a part of each mask corresponding to the through groove section; a first etching step of etching an exposed portion of the base corresponding to the through groove section; a second mask removing step of removing a part of each mask corresponding to the hinge section; a second etching step of etching exposed portions of the base corresponding to the hinge section and the through groove section; a third mask removing step of removing a part of each mask corresponding to the pendulum section; and a third etching step of etching exposed portions of the base corresponding to the pendulum section, the hinge section, and the through groove section.

(6) In the method for manufacturing an acceleration pickup member described above, each mask in the mask forming step may be a positive resist, and a part of each mask may be exposed to light and thereby removed in the first mask removing step, the second mask removing step, and the third mask removing step.

(7) An acceleration pickup member according to the present invention is an acceleration pickup member for use in an acceleration sensor, and the acceleration pickup member includes: a pendulum section swinging in accordance with acceleration; a hinge section coupled to the pendulum section; a support section supporting the pendulum section through the hinge section; and a through groove section between the pendulum section and the support section, in which an interior angle of a center section in the thickness direction in a side surface opposite to the support section of the pendulum section is 90°±10° and an interior angle at the boundary between the pendulum section and the hinge section is 120°±10°.

(8) A MEMS acceleration sensor according to the present invention includes: the acceleration pickup member described above; a movable electrode provided on each principal surface of the pendulum section of the acceleration pickup member; and a fixed electrode which is provided opposite to each movable electrode and to which an alternating voltage is supplied.

Effects of the Invention

The present invention can provide a method for manufacturing a three-dimensional structural member enabling the simplification of manufacturing and a method for manufacturing an acceleration pickup member. Further, the present invention can provide an acceleration pickup member manufactured by the manufacturing method and an acceleration sensor including the acceleration pickup member.

PREFERRED MODE FOR CARRYING OUT THE INVENTION

Figure 1:
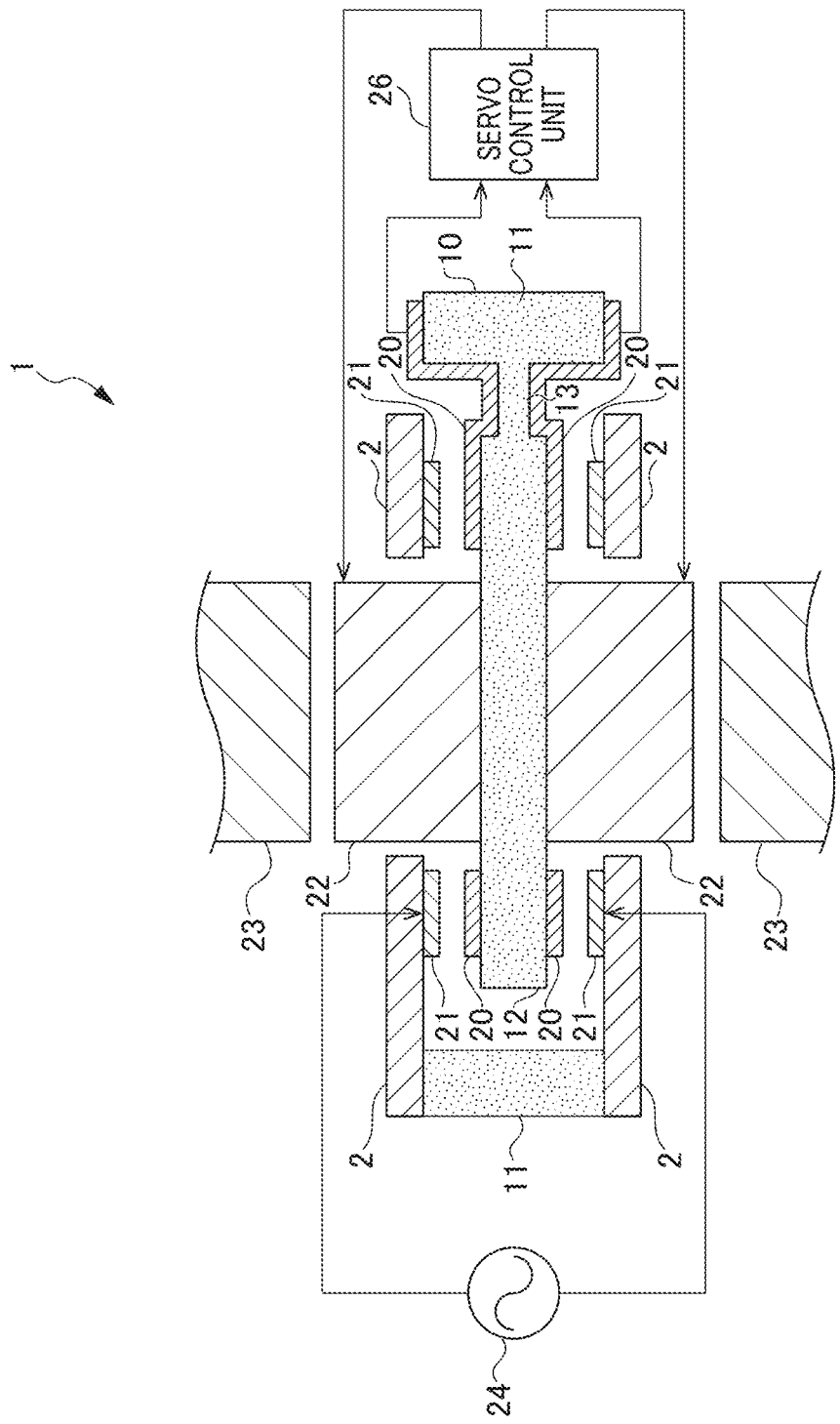
FIG. 1 is a schematic end surface view of an acceleration sensor according to the present embodiment.

Hereinafter, an example of an embodiment of the present invention is described with reference to the attached drawings. In each drawing, the same reference numerals are attached to the same or equivalent portions.

(Acceleration Sensor)

Figure 2:
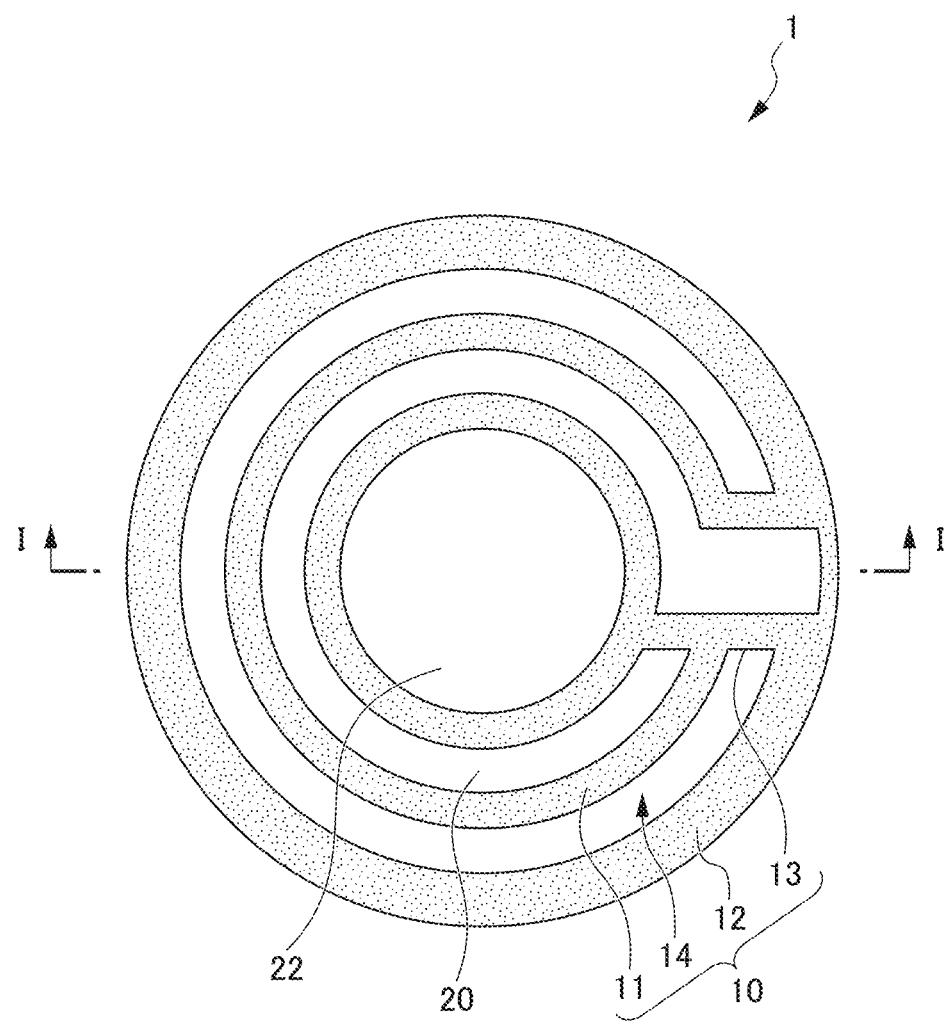
FIG. 2 is a schematic plan view of the acceleration sensor illustrated in FIG. 1.

FIG. 1 is a schematic end surface view of an acceleration sensor according to the present embodiment. FIG. 2 is a schematic plan view of the acceleration sensor illustrated in FIG. 1. FIG. 1 is a cross-sectional view along the I-I line of the acceleration sensor of FIG. 2. An acceleration sensor 1 illustrated in FIG. 1 and FIG. 2 includes an acceleration pickup member 10, movable electrodes 20, fixed electrodes 21, torquer coils 22, magnets 23, a power source 24, a servo control unit 26, and a chassis 2.

In FIG. 1 and FIG. 2, the power source 24 and the servo control unit 26 are illustrated by electrical block diagrams and the other constituent components are structurally illustrated. FIG. 2 omits the illustration of the fixed electrodes 21, the magnets 23, the power source 24, the servo control unit 26, and the chassis 2 in FIG. 1.

The acceleration pickup member 10 includes a support section 11, a pendulum section 12, and a hinge section 13. The support section 11 is fixed to a part of the chassis 2 in the acceleration sensor 1. The pendulum section 12 is coupled to a part of the support section 11 through the hinge section 13 and separated from other parts other than the part of the support section 11 by a through groove section 14. Thus, the pendulum section 12 swings in accordance with acceleration, with the hinge section 13 as a fulcrum. On both the principal surfaces of the pendulum section 12, the movable electrodes 20 and the torquer coils 22 are provided.

The movable electrodes 20 are opposite to the fixed electrodes 21 provided in a part of the chassis 2, for example. The movable electrodes 20 and the fixed electrodes 21 configure a capacitance. To the fixed electrodes 21, an alternating voltage is supplied from the power source 24, for example. Thus, when the pendulum section 12 of the acceleration pickup member 10 swings, a voltage generated in the movable electrodes 20 varies (capacitance type, MEMS (Micro Electro Mechanical System) type)).

The torquer coils 22 are opposite to the magnets 23 provided in a part of the chassis 2, for example. A current flowing into the torquer coils 22 is controlled by the servo control unit 26. The torquer coils 22 also function as a weight for the pendulum section 12 of the acceleration pickup member 10. As the weight for the pendulum section 12, a separate member from the torquer coils 22 may be provided.

The servo control unit 26 performs so-called servo control of controlling a current of the torquer coils 22 based on a signal from the movable electrodes 20. Thus, the servo control unit 26 applies a current to the torquer coils 22 based on displacement (swing amount) of the pendulum section 12 by an acceleration input and performs control to return the pendulum section 12 to a neutral position by the action of electromagnetic force.

Such an acceleration sensor 1 and an acceleration pickup member 10 can detect tilt, motion, vibration, and impact, and are used for various purposes such as measurement of acceleration and shaking of a moving body, analysis of vibration and tilt, and measurement, monitoring, warning, etc. of earthquakes.

(Acceleration Pickup Member)

Figure 3:
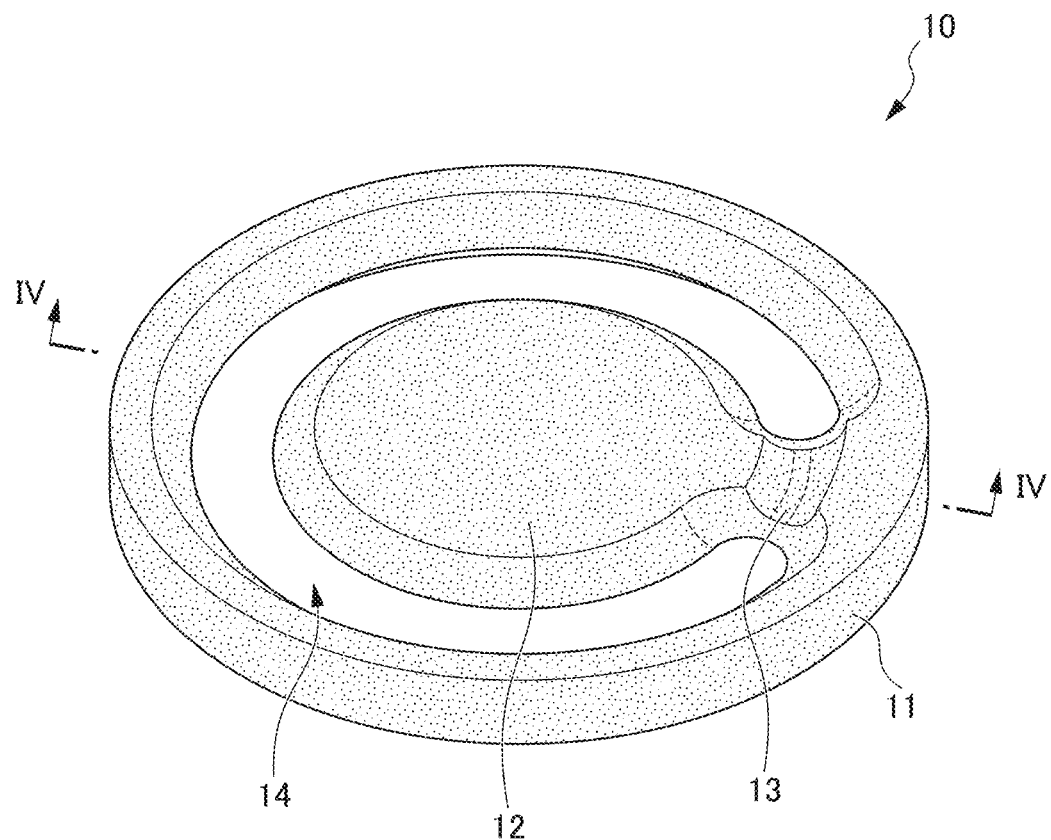
FIG. 3 is a perspective view illustrating an acceleration pickup member according to the present embodiment.
Figure 4:
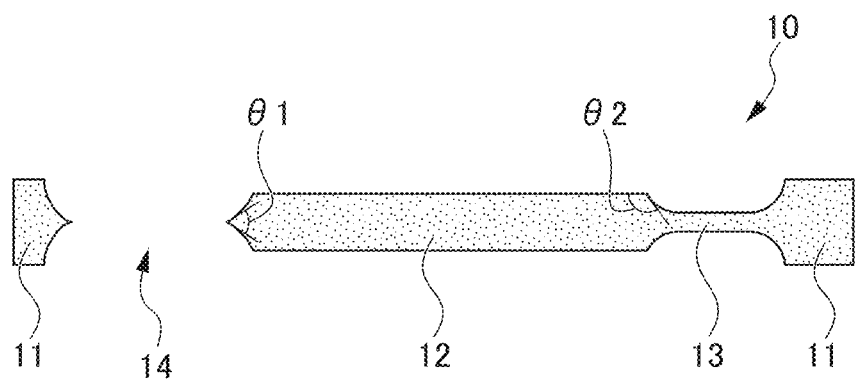
FIG. 4 is a cross-sectional view along the IV-IV line of the acceleration pickup member illustrated in FIG. 3.

FIG. 3 is a perspective view of the acceleration pickup member 10 according to the present embodiment. FIG. 4 is a cross-sectional view along the IV-IV line of the acceleration pickup member 10 illustrated in FIG. 3. The acceleration pickup member 10 illustrated in FIG. 3 and FIG. 4 includes the support section 11, the pendulum section 12, and the hinge section 13.

The support section 11 has a substantially annular shape and supports the pendulum section 12 through the hinge section 13 extending from a part of the inner peripheral surface.

The pendulum section 12 has a substantially disk shape and is provided in an internal space of the support section 11. A part of the outer peripheral surface of the pendulum section 12 is coupled to the hinge section 13. Between a portion other than the part of the outer peripheral surface of the pendulum section 12 and a portion other than the part of the inner peripheral surface of the support section 11, the through groove section 14 is formed. More specifically, the pendulum section 12 is coupled to the support section 11 through the hinge section 13 and separated from the support section 11 in a portion other than the hinge section 13. Thus, the pendulum section 12 functions as a mass section in inertial force mechanics.

The hinge section 13 functions as an elastic section in inertial force mechanics.

The thickness of the pendulum section 12 is less than the thickness of the support section 11. The thickness of the hinge section 13 is less than the thickness of the pendulum section 12.

An interior angle $\theta_1$ of a center section in the thickness direction in the side surface opposite to the support section 11 of the pendulum section 12 is 90°±10° and preferably 90°. An interior angle $\theta_2$ at the boundary between the pendulum section 12 and the hinge section 13 is 120°±10° and preferably 123°. Details thereof are described later.

(Method for Manufacturing Acceleration Pickup Member)

Figure 5A:
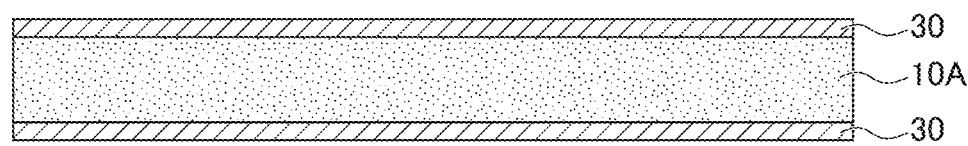
FIG. 5A is a view illustrating a resist application step (mask forming step) of the acceleration pickup member according to the present embodiment.
Figure 5B:
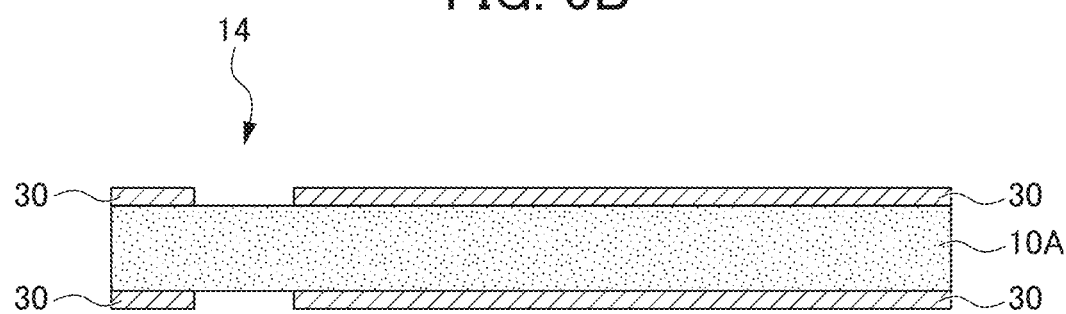
FIG. 5B is a view illustrating a first resist removing step (first mask removing step) of the acceleration pickup member according to the present embodiment.
Figure 5C:
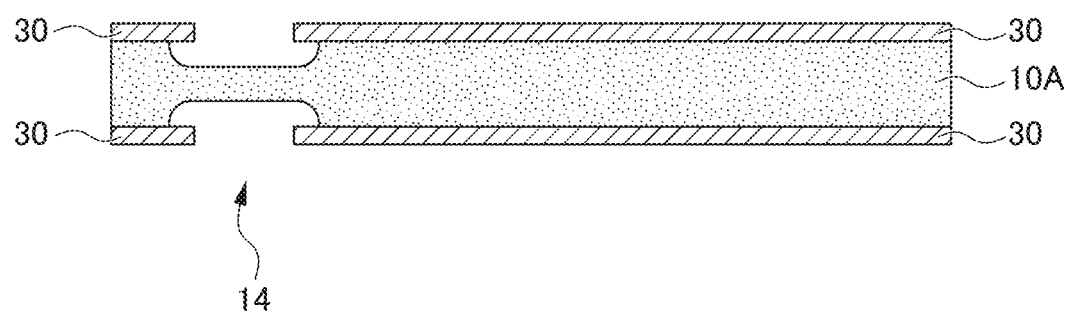
FIG. 5C is a view illustrating a first etching step of the acceleration pickup member according to the present embodiment.
Figure 5D:
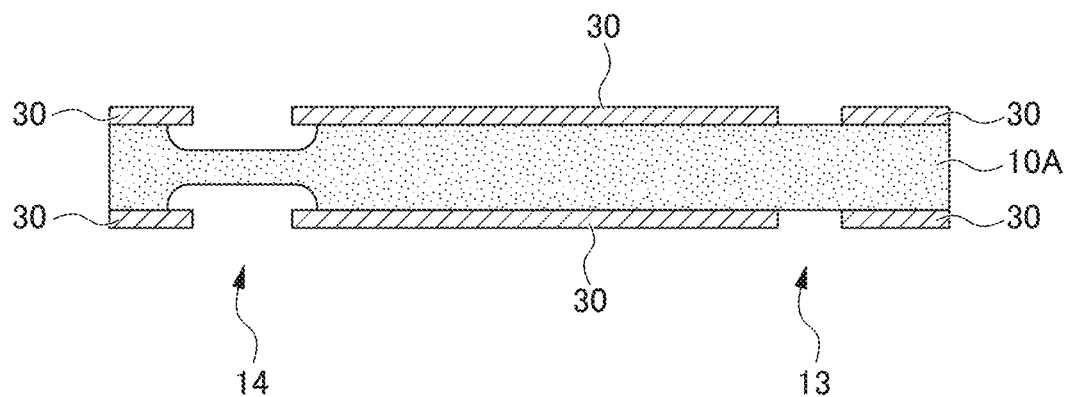
FIG. 5D is a view illustrating a second resist removing step (second mask removing step) of the acceleration pickup member according to the present embodiment.
Figure 5E:
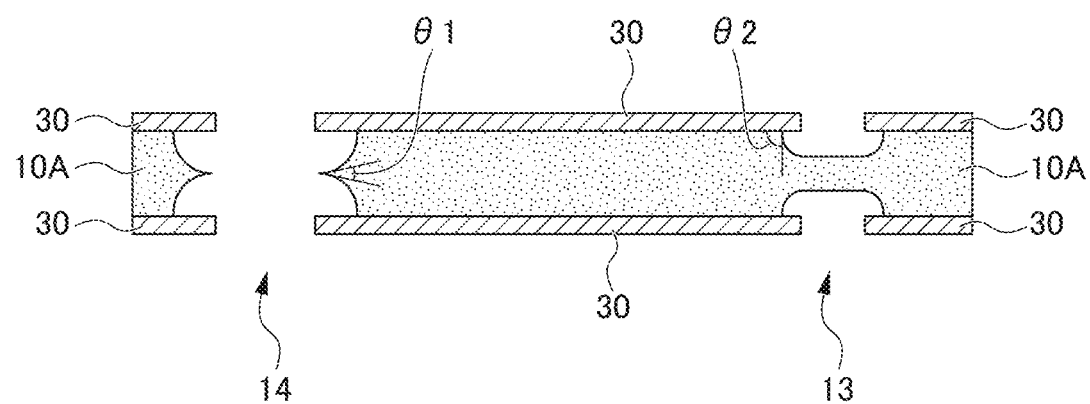
FIG. 5E is a view illustrating a second etching step of the acceleration pickup member according to the present embodiment.
Figure 5F:
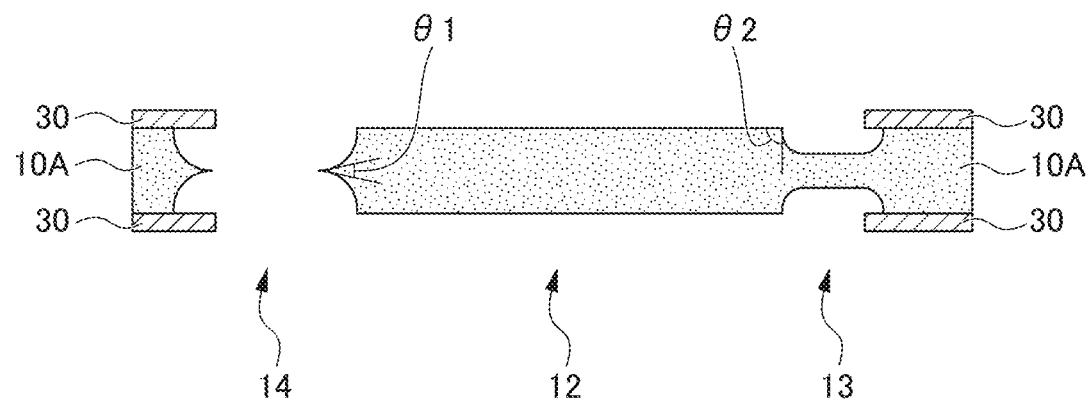
FIG. 5F is a view illustrating a third resist removing step (third mask removing step) of the acceleration pickup member according to the present embodiment.
Figure 5G:
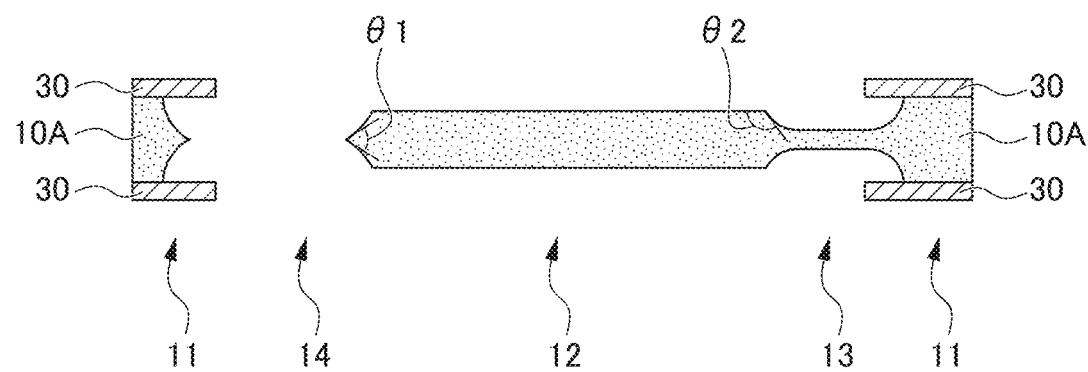
FIG. 5G is a view illustrating a third etching step of the acceleration pickup member according to the present embodiment.

Next, a method for manufacturing the acceleration pickup member 10 is described with reference to FIG. 4 and FIG. 5A to FIG. 5G. FIG. 5A is a view illustrating a resist application step (mask forming step) of the acceleration pickup member 10 according to the present embodiment. FIG. 5B is a view illustrating a first resist removing step (first mask removing step) of the acceleration pickup member 10 according to the present embodiment. FIG. 5C is a view illustrating a first etching step of the acceleration pickup member 10 according to the present embodiment. FIG. 5D is a view illustrating a second resist removing step (second mask removing step) of the acceleration pickup member 10 according to the present embodiment. FIG. 5E is a view illustrating a second etching step of the acceleration pickup member 10 according to the present embodiment. FIG. 5F is a view illustrating a third resist removing step (third mask removing step) of the acceleration pickup member 10 according to the present embodiment. FIG. 5G is a view illustrating a third etching step of the acceleration pickup member 10 according to the present embodiment.

First, as illustrated in FIG. 5A, a positive resist (mask) 30 is applied (formed) over the principal surface of each flat plate-like base 10A (resist application step: mask forming step). Examples of a material of the base 10A include quartz, glass, crystal, silicon, or the like. Examples of materials of the positive resist include AZP4330 (manufactured by Merck Performance Materials Ltd.), FPPR-P60ET (manufactured by Fuji Chemicals Industrial Co., Ltd.), and the like which can be dissolved and removed by being exposed to light. As a method for applying the positive resist, a spin coating method, a spray method, a dipping method, or the like is used.

Next, as illustrated in FIG. 5B, a part of the positive resist 30 corresponding to the thinnest through groove section 14 of the acceleration pickup member 10 (thickness of 0 mm: in the present application, the "thickness of a member" includes a thickness of 0 mm; more specifically, the thinnest portion of the member includes the through groove section having a thickness of 0 mm) or the through groove section 14 having the deepest processing depth is exposed to light (developed). Thus, a part of the positive resist 30 corresponding to the through groove section 14 is removed (first resist removing step: first mask removing step). A mercury lamp is used as an exposure light source, for example.

Next, an exposed portion of the base 10A corresponding to the through groove section 14 is etched (first etching step) as illustrated in FIG. 5C.

Next, a part of the positive resist 30 corresponding to the second thinnest hinge section 13 of the acceleration pickup member 10 or the hinge section 13 having the second deepest processing depth is exposed to light (developed) as illustrated in FIG. 5D. Thus, a part of the positive resist 30 corresponding to the hinge section 13 is removed (second resist removing step: second mask removing step). The same light source as that of the first resist removing step described above is used as an exposure light source.

Next, as illustrated in FIG. 5E, exposed portions of the base 10A corresponding to the hinge section 13 and the through groove section 14 are etched (second etching step).

The same etching liquid as that of the first etching step described above is used as an etching liquid.

Next, a part of the positive resist 30 corresponding to the third thinnest pendulum section 12 of the acceleration pickup member 10 or the pendulum section 12 having the third deepest processing depth is exposed to light (developed) as illustrated in FIG. 5F. Thus, a part of the positive resist 30 corresponding to the pendulum section 12 is removed (third resist removing step: third mask removing step). The same light source as that of the first resist removing step and the second resist step described above is used as an exposure light source.

Next, exposed portions of the base 10A corresponding to the pendulum section 12, the hinge section 13, and the through groove section 14 are etched (third etching step) as illustrated in FIG. 5G. The same etching liquid as that of the first etching step and the second etching step described above is used as an etching liquid.

Next, a remaining portion of the positive resist 30 corresponding to the support section 11 of the acceleration pickup member 10 is exposed to light (developed). Thus, the remaining portion of the positive resist 30 corresponding to the support section 11 is removed, so that the acceleration pickup member 10 illustrated in FIG. 4 is obtained.

All the steps described above are performed in a darkroom (yellow room).

Herein, the resist formation and the resist removal are generally performed for each etching process, i.e., each processed part.

However, according to the method for manufacturing an acceleration pickup member of the present embodiment, the resist forming step is only the first time and the resist removal is not performed for each etching process. Then, an opening section of the resist is expanded or a new opening section is formed in the resist in the order of thinnest to thickest, i.e., in the order of deepest to shallowest of the processing depth of the three-dimensional structural member, so that the etching is repeated. This makes it possible to simply manufacture the acceleration pickup member 10 having the pendulum section 12, the hinge section 13, the support section 11, and the through groove section 14 different in thickness from a flat plate-like base.

Further, according to the method for manufacturing the acceleration pickup member of the present embodiment, a general spin coating method, spray method, dipping method, or the like can be adopted in the resist forming step, since the resist is applied to a flat base before processing. Thus, the acceleration pickup member 10 can be more simply manufactured.

Further, according to the method for manufacturing an acceleration pickup member of the present embodiment, the positive resist dissolvable and removable by exposure to light is used as the resist, and therefore an opening section of the resist can be expanded or a new opening section can be formed in the resist by additional exposure to light. Thus, the acceleration pickup member 10 can be more simply manufactured.

Herein, in the second etching step, the interior angle θ1 of the center section in the thickness direction in the side surface opposite to the support section 11 of the pendulum section 12 is much smaller than 90° as illustrated in FIG. 5E and FIG. 5F, so that so-called burrs occur. However, by further etching the through groove section 14 in the third etching step as illustrated in FIG. 5G, the interior angle θ1 of the center section in the thickness direction in the side surface opposite to the support section 11 of the pendulum section 12 can be set to 90°±10° and preferably 90°, so that burrs can be reduced.

Further, in the second etching step, the interior angle θ2 at the boundary between the pendulum section 12 and the hinge section 13 is about 90° and is an acute angle as illustrated in FIG. 5E and FIG. 5F. In this case, the movable electrodes formed on the boundary between the pendulum section 12 and the hinge section 13 may be disconnected (step disconnection). However, by further etching not only the pendulum section 12 but the hinge section 13 in the third etching step as illustrated in FIG. 5G, the interior angle θ2 at the boundary between the pendulum section 12 and the hinge section 13 can be set to an obtuse angle of 120°±10° and preferably 123°. Thus, the disconnection (step disconnection) of the movable electrodes formed on the boundary between the pendulum section 12 and the hinge section 13 can be reduced.

Thus, the interior angle θ1 of the center section in the thickness direction in the side surface opposite to the support section 11 of the pendulum section 12 is 90°±10° and preferably 90° in the acceleration pickup member 10 manufactured by the method for manufacturing an acceleration pickup member of the present embodiment. The interior angle θ2 at the boundary between the pendulum section 12 and the hinge section 13 is 120°±10° and preferably 123°. Thus, burrs can be reduced in the center section in the thickness direction in the side surface opposite to the support section 11 of the pendulum section 12. Further, the disconnection (step disconnection) of the movable electrodes formed on the boundary between the pendulum section 12 and the hinge section 13 can be reduced.

Although the embodiment of the present invention is described above, the present invention can be variously altered and modified without being limited to the embodiment described above. For example, the embodiment described above describes the method for manufacturing the acceleration pickup member 10 for use in an acceleration sensor by molding a flat plate-like base, in which the acceleration pickup member 10 has the pendulum section 12, the hinge section 13, the support section 11, and the through groove section 14 (i.e., three-dimensional structural member having four portions different in thickness). However, the features of the present invention are not limited thereto and the present invention is applicable also to the method for manufacturing a three-dimensional structural member having a plurality of portions different in thickness by molding a flat plate-like base. In this case, a combination of the resist removing step (mask removing step) and the etching step may be performed in the order of thinnest to thickest of the three-dimensional structural member to the resist (mask) and the base corresponding to each of the plurality of portions of the three-dimensional structural member.

Further, although the resist (mask) is applied to (formed on) each principal surface of the base in the resist application step (mask forming step) in the embodiment described above, the resist (mask) may be applied (formed) over at least one principal surface.

EXPLANATION OF REFERENCE NUMERALS 1 acceleration sensor
2 chassis
10 acceleration pickup member
10A base
11 support section 12 pendulum section
13 hinge section
14 through groove
20 movable electrode
21 fixed electrode
22 torquer coil
23 magnet
24 power source
26 servo control unit
30 positive resist (mask)

The invention claimed is:

1. A method for manufacturing a three-dimensional structural member including a plurality of portions different in thickness by molding a flat plate-like base, the method comprising:
 a mask forming step of forming a mask over at least one principal surface of the base;
 a first mask removing step of removing a part of the mask;
 an etching step of etching an exposed portion of the base;
 a second mask removing step of removing a part of the mask corresponding to a second thinnest portion of the three-dimensional structural member,
 wherein a combination of the first and second mask removing steps and the etching step is performed to the mask and the base corresponding to each of the plurality of portions of the three-dimensional structural member in an order of thinnest to thickest of the three-dimensional structural member, and
 wherein the second mask removing step is performed only after a start of the etching step.

2. The method for manufacturing a three-dimensional structural member according to claim 1, wherein
 the mask in the mask forming step is a positive resist, and
 a part of the mask is exposed to light and thereby removed in the mask removing step.

3. A method for manufacturing a three-dimensional structural member including four portions different in thickness by molding a flat plate-like base, the method comprising:
 a mask forming step of forming a mask over at least one principal surface of the base;
 a first mask removing step of removing a part of the mask corresponding to a thinnest portion of the three-dimensional structural member;
 a first etching step of etching an exposed portion of the base corresponding to the thinnest portion of the three-dimensional structural member;
 a second mask removing step of removing a part of the mask corresponding to a second thinnest portion of the three-dimensional structural member;
 a second etching step of etching exposed portions of the base corresponding to the second thinnest portion and the thinnest portion of the three-dimensional structural member;
 a third mask removing step of removing a part of the mask corresponding to a third thinnest portion of the three-dimensional structural member; and
 a third etching step of etching exposed portions of the base corresponding to the third thinnest portion, the second thinnest portion, and the thinnest portion of the three-dimensional structural member,
 wherein the second mask removing step is performed only after a start of the first etching step.

4. The method for manufacturing a three-dimensional structural member according to claim 3, wherein
 the mask in the mask forming step is a positive resist, and
 a part of the mask is exposed to light and thereby removed in the first mask removing step, the second mask removing step, and the third mask removing step.

5. A method for manufacturing an acceleration pickup member for use in an acceleration sensor by molding a flat plate-like base, the acceleration pickup member including a pendulum section, a hinge section coupled to the pendulum section, a support section supporting the pendulum section through the hinge section, and a through groove section between the pendulum section and the support section, the method comprising:
 a mask forming step of forming a mask over each principal surface of the base;
 a first mask removing step of removing a part of the mask corresponding to the through groove section;
 a first etching step of etching an exposed portion of the base corresponding to the through groove section;
 a second mask removing step of removing a part of the mask corresponding to the hinge section;
 a second etching step of etching exposed portions of the base corresponding to the hinge section and the through groove section;
 a third mask removing step of removing a part of the mask corresponding to the pendulum section; and
 a third etching step of etching exposed portions of the base corresponding to the pendulum section, the hinge section, and the through groove section,
 wherein the second mask removing step is performed only after a start of the first etching step.

6. The method for manufacturing an acceleration pickup member according to claim 5, wherein
 the mask in the mask forming step is a positive resist, and
 a part of the mask is exposed to light and thereby removed in the first mask removing step, the second mask removing step, and the third mask removing step.

7. An acceleration pickup member for use in an acceleration sensor, the acceleration pickup member comprising:
 a pendulum section swinging in accordance with acceleration;
 a hinge section coupled to the pendulum section;
 a support section supporting the pendulum section through the hinge section; and
 a through groove section between the pendulum section and the support section, wherein
 an interior angle of a center section in a thickness direction in a side surface opposite to the support section of the pendulum section is 90°±10°, and
 an interior angle in a boundary between the pendulum section and the hinge section is 120°±10°.

8. A MEMS acceleration sensor comprising:
 the acceleration pickup member according to claim 7;
 a movable electrode provided on each principal surface of the pendulum section of the acceleration pickup member; and
 a fixed electrode provided opposite to the movable electrode, an alternating voltage being supplied to the fixed electrode.

* * * * *